United States Patent
Furst

(10) Patent No.: US 6,831,577 B1
(45) Date of Patent: Dec. 14, 2004

(54) SIGMA DELTA MODULATOR HAVING ENLARGED DYNAMIC RANGE DUE TO STABILIZED SIGNAL SWING

(75) Inventor: Claus Erdmann Furst, Roskilde (DK)

(73) Assignee: Sonion A/S, Roskilde (DK)

( * ) Notice: Subject to any disclaimer, the term of this patent is extended or adjusted under 35 U.S.C. 154(b) by 0 days.

(21) Appl. No.: 10/059,270

(22) Filed: Jan. 31, 2002

Related U.S. Application Data

(60) Provisional application No. 60/265,612, filed on Feb. 2, 2001.

(51) Int. Cl.[7] .............................. H03M 3/00; H03M 1/12
(52) U.S. Cl. ........................................ 341/143; 341/155
(58) Field of Search ................................ 341/143, 118, 341/120, 155; 324/614; 455/557; 330/109; 702/40; 342/68

(56) References Cited

U.S. PATENT DOCUMENTS

| | | | | | |
|---|---|---|---|---|---|
| 5,187,482 | A | * | 2/1993 | Tiemann et al. | 341/143 |
| 5,744,969 | A | * | 4/1998 | Grochowski et al. | 324/614 |
| 5,757,300 | A | * | 5/1998 | Koilpillai et al. | 341/143 |
| 5,805,093 | A |   | 9/1998 | Heikkila et al. | 341/143 |
| 5,818,374 | A | * | 10/1998 | Tan | 341/143 |
| 5,986,598 | A | * | 11/1999 | Mittel | 341/143 |
| 6,112,103 | A | * | 8/2000 | Puthuff | 455/557 |
| 6,246,283 | B1 | * | 6/2001 | Ahuja et al. | 330/109 |
| 6,275,177 | B1 | * | 8/2001 | Ho et al. | 341/143 |
| 6,369,729 | B1 | * | 4/2002 | Srinivasan et al. | 341/143 |
| 6,670,902 | B1 | * | 12/2003 | Melanson et al. | 341/143 |

OTHER PUBLICATIONS

Peluso, Vincenzo et al. "A 900–mV Low–Power ΔΣ A/D Converter with 77–dB Dynamic Range." IEEE Journal of Solid–State Circuits, vol. 33, No. 12, Dec. 1998; pp. 1887–1897.

Jorgenson, Ivan et al. "Design of a 3$^{rd}$ Order Micro Power Switched Current ΔΣ–Modulator." The Third International Conference on Electronics, Circuits and Systems, Oct. 13–16, 1996, vol. 2, pp. 948–951.

Furst, Claus E. "Low Power/Low Voltage Interface Circuitry for Capacitive Sensors; Design, Optimization and Applications." Department of Information Technology, Technical University of Denmark. Mar. 31, 1997; pp. 71–86 and pp. 123–138.

Furst, Clause E. "A High Resolution Switched Capacitor 1bit ΣΔ Modulator For Low–Voltage/Low–Power Applications." Department of Information Technology, Technical University of Denmark, no date listed.

\* cited by examiner

Primary Examiner—Patrick Wamsley
(74) Attorney, Agent, or Firm—Harness, Dickey & Pierce, PLC

(57) ABSTRACT

A method for designing a single loop Sigma Delta Modulator, and a single loop Sigma Delta Modulator. A microphone comprising the above Sigma Delta Modulator (SDM) and a cellular phone or hearing aid incorporating the microphone. A design algorithm for an SDM is described said method resulting in a SDM with a maximum SNR for a given NTF order and the method assures stability while still keeping the distortion in the output signal at a minimum for signals exceeding MSA. The method further takes the presence of non idealities in i.e. components into consideration and makes the SDM less sensitive to these non idealities. Furthermore the method tailors the coefficients and the design of the NTF to fit a low power low voltage integrated circuit implementation.

7 Claims, 5 Drawing Sheets

SIGMA DELTA MODULATOR HAVING ENLARGED DYNAMIC RANGE DUE TO STABILIZED SIGNAL SWING

This application claims the benefit of Provisional application Ser. No. 60/265,612, filed Feb. 2, 2001.

FIELD OF THE INVENTION

The present invention relates to a method for designing a sigma delta modulator (SDM). Furthermore, the present invention relates to a SDM having an enlarged maximum dynamic range compared to conventional SDM. Even further, the present invention relates to microphone modules, hearing aids, cellular phones and head-sets comprising a SDM according to the present invention.

BACKGROUND OF THE INVENTION

SDMs have received much attention in recent years. The combination of over-sampling and noise shaping has revealed performance levels, which were not achievable just a years ago in integrated circuit technology. The principle can be used in many applications. Examples such as analog to digital converters, digital to analog converters, phase locked loops, PDM systems, PWM systems etc. have proven the versatility of this principle. The basic idea is that clock frequency is traded off for resolution.

A generic model (purely mathematical description) of a SDM shown in FIG. 1, consists of a pre-filter 101, a feedback filter 102 and a quantizer 103. The pre-filter and the feedback filter have the transfer-functions G(z) and H(z). To obtain a linear model of the modulator the quantizer is replaced by a linear gain block 104, and a noise source 105. The gain block has a gain of k. This model allows us to use all the standard mathematical tools available for linear systems for analysing the SDM.

To characterize the SDM two transfer functions are defined. These are the Signal Transfer Function (STF) and the Noise Transfer Function (NTF). The STF is defined as the transfer-function from the input of the modulator to the output. And the NTF is defined as the transfer-function from the quantization noise source to the output.

The two transfer functions are given by:

$$STF_k = \frac{k \cdot G(z)}{1 + k \cdot H(z)} \quad NTF_k = \frac{1}{1 + k \cdot H(z)}$$

Where k is the equivalent linear gain of a comparator.

A specific group of SDM, which are of special interest, is one bit single loop SDM. This type of SDMs have the advantage of being especially easy to implement in integrated circuit technology, and especially for low voltage applications the very simple implementation is advantageous.

One bit single loop SDMs comprise a plurality of integrators embedded in a feedback loop with a plurality of feedback branches. This topology forms the feedback filter 102 and the pre-filter 101. It can be shown that the NTF is a high pass filter function while the STF is a low pass filter-function. I.e. the quantization noise is suppressed at low frequencies while the low frequency input signal is passed unaffected through the modulator. A subsequent filter, digital or analog, can then remove the high frequency noise thus leaving the low frequency part of the signal with an improved signal to noise ratio.

When designing a SDM it is the design of the filter, which influences the performance of the SDM. It is of interest to choose the order and the coefficients of the filter in such a way that the noise is minimized in the frequency range of interest.

It is advantageous to design the NTF as a Butterworth filter as it has a low sensitivity to coefficient variations. A simplified Butterworth NTF is shown in FIG. 2. If the frequencies below the broken line 203 in the output of the SDM are the most important (such as in audio applications), then the NTF should suppress the lower frequency noise as much as possible. This can be achieved in two ways, either
1. by increasing the order of the filter and thereby increase the slope 205 of the noise transfer, or
2. by increasing the cut-off frequency 201.

For a filter of a given order, the only choice available is the choice of having a NTF with a very high cut-off frequency. However, there is an upper limit how much the cut-off frequency of the NTF can be increased. Increasing the cut-off frequency results in that the maximum stable amplitude (MSA) of the input signal decreases. All higher order SDM's have the property that when the input signal's amplitude exceeds a certain MSA value the SDM becomes unstable and starts to oscillate. The definition of a higher order SDM is that the number of integrators in the loop is larger than two.

To summarize, the trade-offs when choosing the cut-off frequency in the NTF are:
high cut-off frequency results in less noise and a lower MSA.
whereas
low cut-off frequency results in more noise and higher MSA.

According to the above, it is therefore of interest to design the filter in such a way that the optimal cut-off frequency is chosen—meaning a cut-off frequency resulting in maximum MSA vs. noise ratio—i.e. maximum signal to noise ratio ($SNR_{max}$). For each order of SDM's and NTF filter function an optimum NTF cut-off frequency exists for which the $SNR_{max}$ is maximized.

The modulator has to be capable of handling input signals larger than the MSA. A typical way of assuring stability of the modulator is to reset the integrators of the modulator when the amplitude of the input signal exceeds MSA. Instability can also be detected by monitoring the output signal, or it can be detected by monitoring, independently, the output signals of each integrator, and then resetting the integrators accordingly.

The above-mentioned way of accounting for instability is very effective, but unfortunately, it also introduces distortion in the output signal when the integrators are reset. An alternative way of ensuring stability is to limit the output swing of the integrators so that the signal swing at the output of each integrator do not increase uncontrollable—even in the situation when the input signal exceeds MSA causing the modulator to become unstable. This approach is very attractive as it introduces minimum distortion and gives a large dynamic range (DNR). Unfortunately, this approach is very difficult to implement in low voltage circuit design.

It is therefore of interest to establish a new and optimized design route for SDMs to ensure maximum DNR and stability while keeping the distortion in the output signal at a minimum for input signals exceeding MSA.

The dynamic range is defined as the ratio between the maximum output signal power and the output idle (no input signal) noise power.

When designing SDMs for use in low power/low voltage applications a variety of factors have to be taken into consideration since the implementation is not ideal compared to an ideal SDM. Examples of this being: non-infinite gain of integrators, circuit noise etc.

It is an object of the present invention to provide a new and optimized design route for SDMs for low power and low voltage applications to ensure maximum DNR, maximum $SNR_{max}$ and maximum stability.

SUMMARY OF THE INVENTION

The above-mentioned object is complied with by providing, in a first aspect, a method for designing a sigma-delta-modulator comprising a plurality of cascaded integrators and a comparator, the method comprising the steps of:

providing an input signal to an input of the sigma-delta-modulator, determining an amplitude of a signal at an output of at least one of the plurality of integrators, adjusting the signal swing of the output signals of those of the integrators being placed closest in the signal path to the input of the sigma-delta-modulator by adjusting characteristics of those integrators in such a way that the signal swing of those integrators being placed closest to the input is significantly smaller than the signal swing of the remaining integrators.

By cascaded integrators is meant that an integrator output is connected to the input of a following integrator. An integrator can in an embodiment be realized using digital or analog electronics.

A comparator is a component transforming the amplitude continuous input signal to an amplitude discrete output signal having either a first or a second value. The input of the SDM may be the input of the first integrator in the cascade of integrators.

Typically, the output signals are determined for all integrators even though only some of them are affected in terms of having their outputs reduced. The adjusting of the characteristics of the integrators may be done by adjusting the gain of the integrators and/or values of feedback factors.

The adjusting step may be performed by
adjusting the signal swing of the output signal of a first integrator to a first value, and
adjusting the signal swing of the output signal of a second integrator to a second value, the second value being larger than the first value.

The integrators being placed closest in the signal path to the input of the sigma-delta-modulator may be the two integrators being placed immediately after the input. The signal swing of the output signal of these two integrators may be below 20 percent of the full scale output signal level of the quantizer. The signal swing of the remaining integrators are adjusted so as to increase along the signal path.

Again, the adjusting step may be performed by adjusting gain parameters of the integrators, such as adjusting the feedback gain.

In a second aspect, the present invention relates to a sigma-delta-modulator comprising a plurality of cascaded integrators and at least one comparator, the sigma-delta-modulator being designed using a method according to the first aspect of the present invention.

In a third aspect, the present invention relates to a method of controlling a sigma-delta-modulator comprising a plurality of cascaded integrators and a comparator, the method comprising the steps of:

monitoring the signal swing of an output signal of at least one of the plurality of integrators and determining if the monitored signal swing exceeds a predefined threshold value, and in case the monitored signal swing exceeds the predefined threshold value reducing the output signal with a predefined factor or value so as to bring the monitored signal swing below the predefined threshold value.

Thus, if the signal swing at the output of the integrators should become close to unstable (the predefined threshold value) the reduction with the predefined factor or value ensures that instability never occurs and the integrators' signal swing remains stable.

The predefined threshold value may be associated with a maximum stable input amplitude of the sigma-delta-modulator.

The input signal being introduced may be within the range of 95–99% of a predefined MSA. The signal swings at the output of the integrators is reduced resulting in very low sensitivity to circuit imperfections.

In a fourth aspect, the present invention relates to a sigma-delta-modulator comprising a plurality of cascaded integrators, at least one comparator, and means for performing a method according to the third aspect of the present invention.

In a fifth aspect, the present invention relates to a sigma-delta-modulator having a maximum signal (S) to noise (N) plus total harmonic distortion (THD) ratio, S/(N+THD), being larger than a predetermined value, said predetermined value being determined from a maximum stable amplitude value and a noise power value, the maximum stable amplitude value and the noise power value being derivable from an obtainable noise transfer function associated with the sigma-delta-modulator.

The predetermined value may be determined using the expression $$20 \log_{10} \frac{MSA_{rms}}{Noise_{rms}}$$

wherein $MSA_{rms}$ is a root mean square value of the maximum stable amplitude value, and wherein $Noise_{rms}$ is the root mean square value of the noise power value which may be derived by summing the energy of the idle noise in the band of interest.

$MSA_{rms}$ may be derived from the Gaussian ability criterion by solving the equation:

$$\text{Min}(A(K)) = \frac{1 - MSA_{peak}^2}{1 - MSA_{peak}^2 - \frac{2}{\pi} e^{-2 \cdot (erf^{-1}(MSA_{peak}))^2}}$$

where A (K)=2-norm(NTF(K))—i.e. the two-norm of the impulse of NTF as a function of the quantizer gain K.

If the signal is a sine wave then $MSA_{rms}=MSA_{peak}/\sqrt{2}$.

The sigma-delta-modulator may comprise a plurality of integrators and a least one comparator. The plurality of integrators may be cascaded.

In a sixth aspect, the present invention relates to a microphone module comprising a sigma-delta-modulator according to the second or to the fifth aspect of the present invention. This microphone module may form part of a hearing aid, a cellular phone, or a head-set.

In a seventh aspect, the present invention relates to a mobile unit comprising a sigma-delta-modulator according to the second or to the fifth aspect of the present invention. The mobile unit may be selected from the group consisting of hearing aids, cellular phones, or head-sets.

BRIEF DESCRIPTION OF THE DRAWINGS

In the following preferred embodiments of the present invention will be described in further details with reference to the accompanying figure, where.

DETAILED DESCRIPTION OF THE INVENTION

Figure 1:
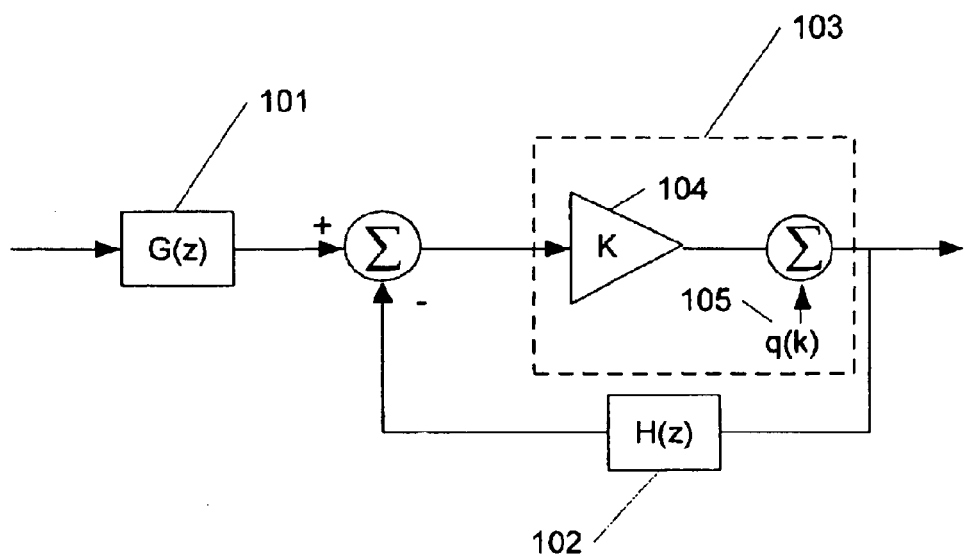
FIG. 1 shows a generic model of a SDM.

In the following, the steps of designing the filter part 102 (FIG. 1) of a SDM according to the present invention is described.

Figure 3:
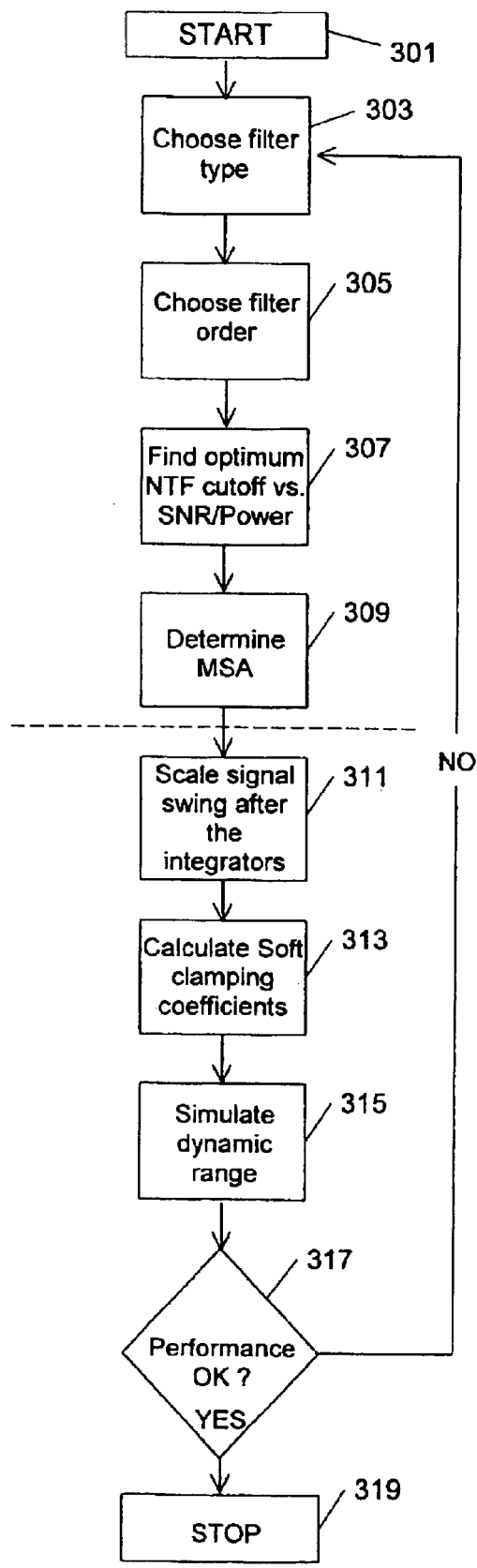
FIG. 3 is a flow diagram showing the steps of filter design in SDM according to the present invention.

FIG. 3 shows the design steps according to the present invention. First, the filter type is chosen 303—this is done by choosing filter coefficients according to the desired filter type. A Butterworth filter is often used, because of its low sensitivity to variations in the coefficients and because Butterworth NTF's are very reliable. Thus, the stability/instability of the filter can be precisely predicted.

Then the filter type is fixed, the order of the filter is chosen 305 according to specifications for the modulator. An initial guess for the order needed can be obtained from:

$$SNR_{\max} \approx 20\log_{10}\frac{(2N+1)\cdot OSR^{2N+1}}{\pi^{2N}}$$

where N is the order of the SDM and OSR is the oversampling ratio. $SNR_{max}$ is the required maximal signal to noise ratio for the SDM.

This formula provides an optimistic guess, but as an initial guess, the formula is very useful. As already mentioned, the order of the filter influences the slope of the NTF filter characteristic shown in FIG. 2. Choosing a higher order filter increases the slope of the NTF (line 205), but it also makes the SDM more complex.

Figure 2:
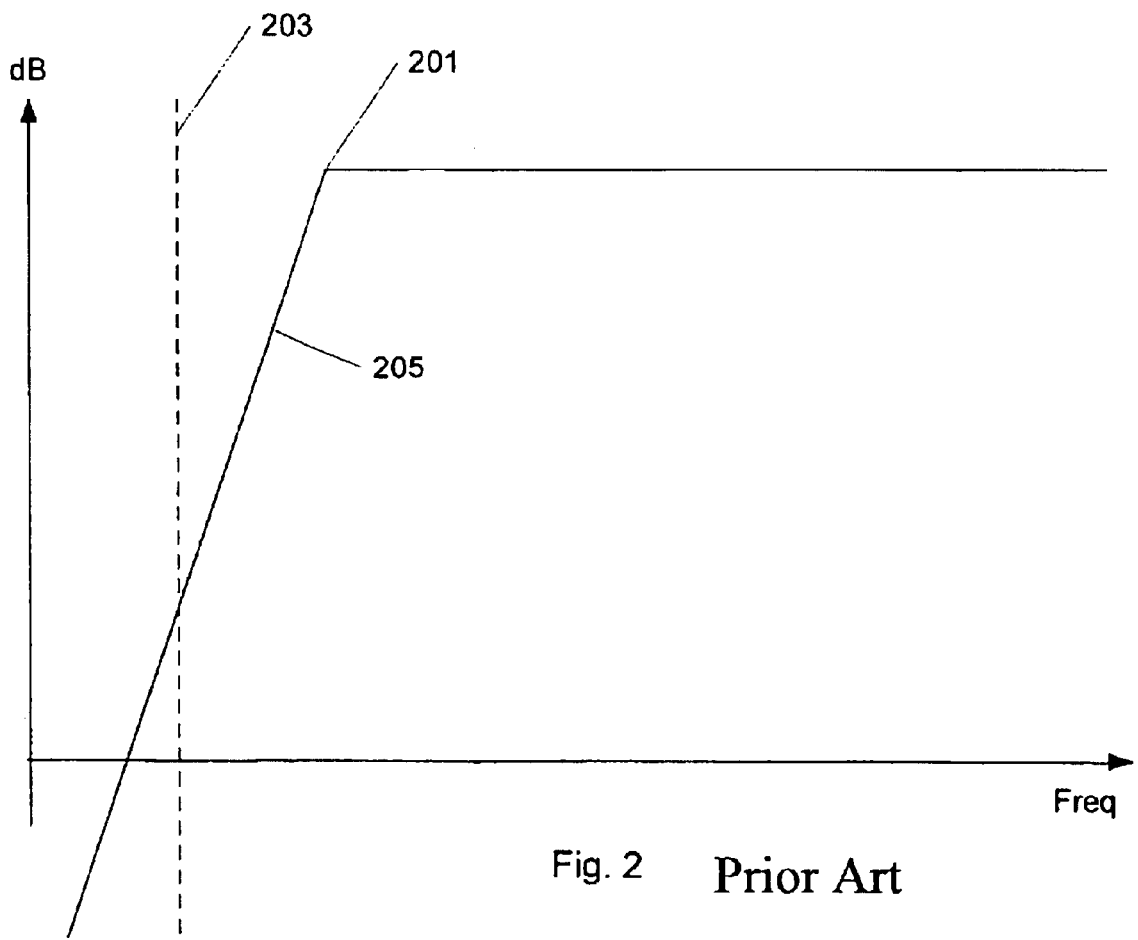
FIG. 2 shows a simplified Butterworth NTF.

In audio-related applications it is primarily the low frequencies that are important. The reason for this is that the human ear is only sensitive to such low frequencies. In FIG. 2 the important frequencies are below the dashed line 203—therefore the noise should be minimized in this frequency range. As already mentioned this can be done by increasing the order of the filter or by moving the NTF cut-off frequency to higher frequencies, although by increasing the NTF cut-off, the MSA will be lowered. Contrary, a lower NTF cut-off frequency results in more noise and higher MSA.

The maximum achievable signal to noise ratio $SNR_{max}$ of a conventional SDM is defined as follows:

$$SNR_{\max} = 20\log_{10}\frac{MSA_{rms}}{Noise_{rms}}$$

Figure 4:
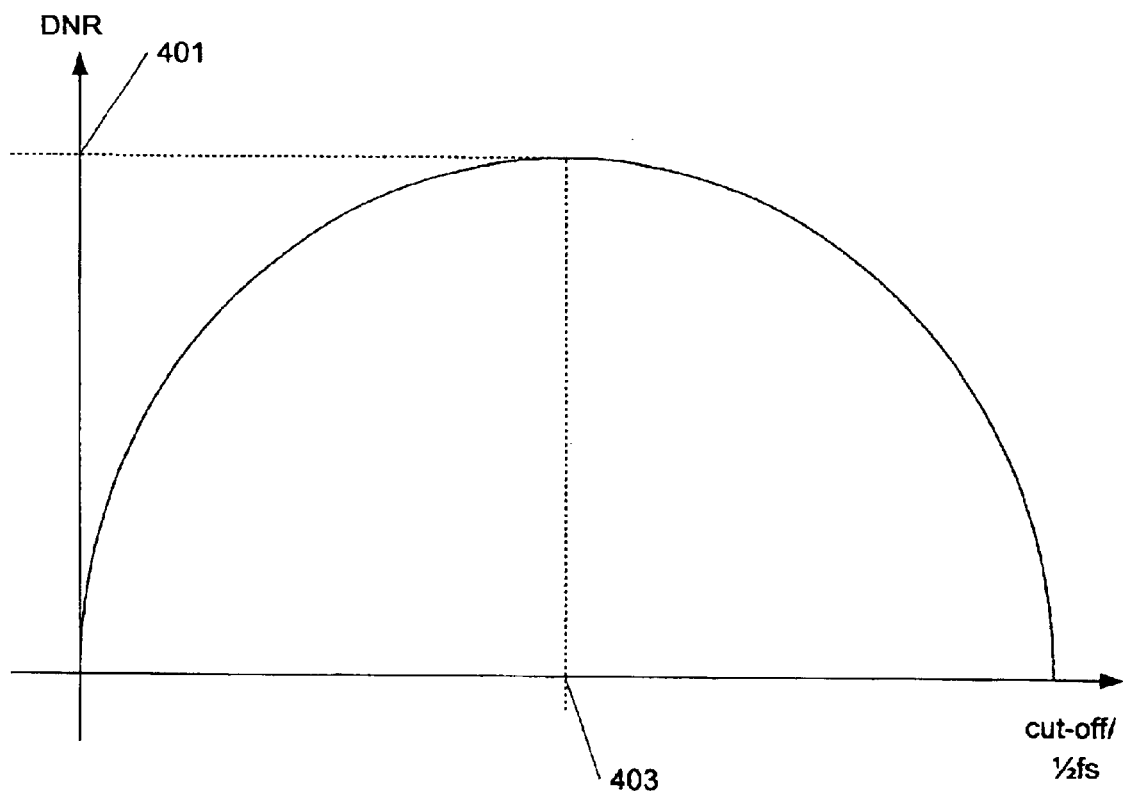
FIG. 4 shows a simplified transfer function showing the SNR as function of the cut-off frequency.

In FIG. 4, a simplified transfer function showing the SNR as function of the cut-off frequency is shown. The optimal cut-off frequency is the frequency with the highest SNR, this frequency is shown at 403 and the corresponding optimal $SNR_{max}$ is shown at 401.

The cut-off frequency is determined realising the above dependency between MSA and cut-off, but also implementation limitations have to be considered. For low power integrated circuits this means that a $SNR_{max}$ vs. power consumption ratio should be defined.

If one assumes that the power needed to process a signal is inversely proportional to MSA squared, then the NTF cut-off should be determined as the cut-off corresponding to the optimum of the curve describing the SNR vs. power relationship—thus $$SNR_{max} vs.\text{Power} = SNR_{max} + 20\log_{10}MSA_{rms}$$

Finally, in step 309 (FIG. 3), the MSA corresponding to the chosen cut-off frequency is determined.

Depending the requirements, the optimum resulting in the highest $SNR_{max}$, or the optimum resulting in the best $SNR_{max}$ vs. power consumption can be chosen.

Figure 5:
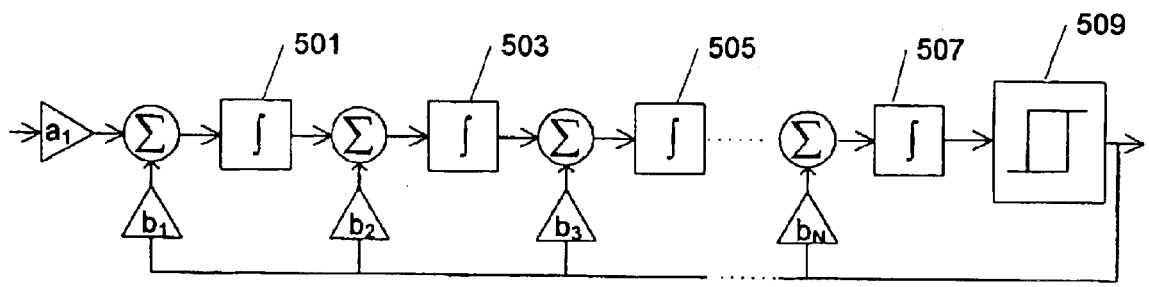
FIG. 5 shows a single loop SDM.

A single loop SDM is shown in FIG. 5. It consists of a number of integrators (501, 503, 505, 507) and a comparator 509. The number of integrators equals the order of the filter. Each integrator has a feedback loop via feedback factors $b_1$, $b_2, b_3 \ldots b_n$ and a gain factor $g_1, g_2, g_3 \ldots g_n$. Furthermore the input can, if necessary, be amplified by a factor $a_1$. One can also add/introduce other gain factors, $a_2, a_3 \ldots a_n$ and feedback loops but for simplicity reasons they are not shown/mentioned here.

A actual implementation of a single loop SDM will always be non-ideal compared to a theoretical/ideal SDM. The non-ideal aspects are introduced because of non-infinite gain of integrators, noise etc. Therefore, even though the above theoretical rules have been followed, the real SDM will perform less efficiently than the ideal modulator. Performance degradation can be in terms of $SNR_{max}$, distortion etc.

It will now be described how the ideal modulator can be re-designed to fit a real circuit implementation—especially regarding a low voltage/low power circuit implementation.

In a chain of integrators embedded in a feedback-loop, not all errors are equally important. It can be shown that errors introduced by the first integrator will be multiplied with a gain factor and present at the output, while errors introduced by the second will be high pass filtered by a first order filter.

Generally, an error introduced by an integrator will be filtered by a high pass filter having an order being one lower than the number of that integrator. Thus, the most important errors are introduced by the first integrator, the second most important are introduced by the second and so on. In the present content errors mean noise, distortion non-infinite gain etc.

It is therefore important that the first and the second integrator each has a high open-loop gain, and that the first integrator has low noise and is linear. To account for these non-ideal conditions when scaling the coefficients, the signal swing may be below 20 percent of the full scale output signal level of the quantizer. This will allow a circuit implementation of the first two integrators to achieve very high open loop gains even at very low supply voltages. The signal swings at the output of the subsequent integrators can then be allowed to be much larger. This means that the circuit implementation of these integrators becomes much more simple to implement, and that the power consumption from these can be lowered.

Figure 6:
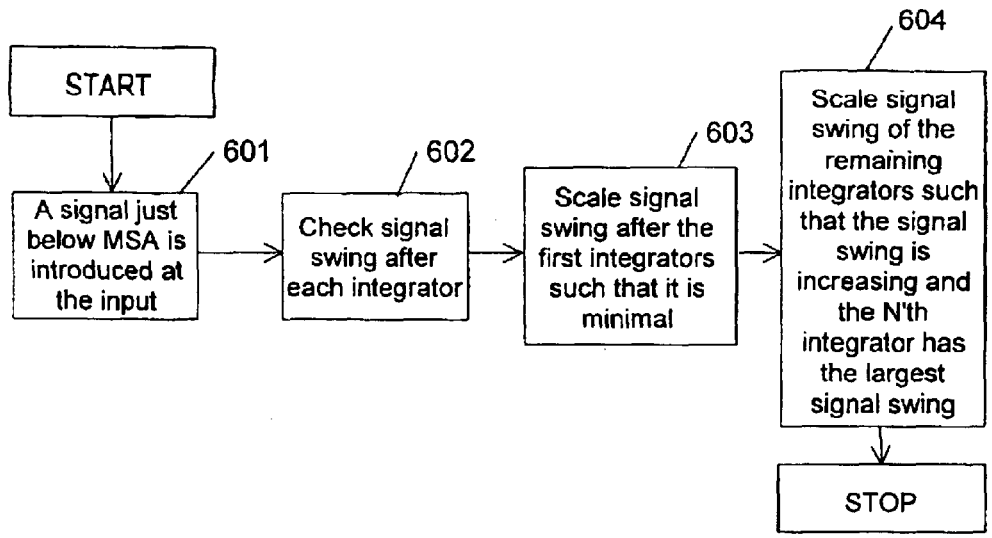
FIG. 6 shows a diagram of the process of designing coefficients for the individual integrators.

FIG. 6 shows a diagram of the process of scaling the signal swing as mentioned in 311 in FIG. 3, whereby a minimum of signal swing is obtained at the first integrators. First, an input signal having a value just below the determined MSA is introduced to the SDM-601.

The amplitude distribution of the signal at the first integrator is then monitored. The amplitude can then be scaled by re-calculating the gain (g) of the first integrator, the gain (g) of the second integrator, and a feedback parameter of the second integrator b. This must be done in such a way that the NTF is preserved.

The signal swing after each integrator is monitored 602 and, in a preferred embodiment, the output of the first two integrators are minimized by adjusting the coefficients of these integrators 603. When the coefficients of these integrators have been adjusted, the remaining integrator coefficients are adjusted 604 in such a way that the signal swings after the third integrator and the following integrators have a larger signal swing than the signal after the first and the second integrator. The SDM now complies with the above-mentioned advantages.

It is to be mentioned that the invention is not to be restricted to the above. The principle of the invention is that the first integrators should have a small signal swing allowing the remaining integrators to have a larger signal swing, whereby these integrators are much simpler to implement and the power consumption can be lowered.

The above-mentioned procedure is linked directly to the method for ensuring stability of the SDM. When a signal equal to or above MSA is applied to the input of the SDM, the modulator becomes unstable. This unstable situation causes the signal-levels at the output of each integrator to increase in an uncontrollable way. In order to avoid this, clamping is introduced. When the signal swing after an integrator exceeds a certain level, the integrator is reset.

Figure 7:
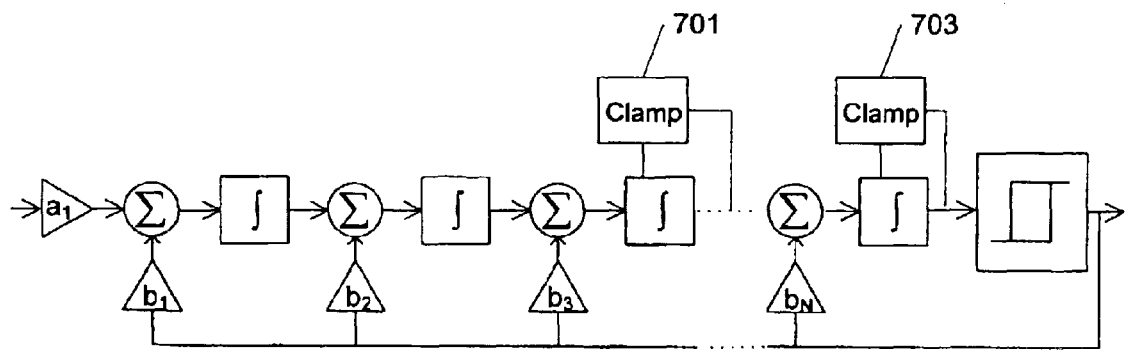
FIG. 7 shows an example of a SDM with clamping.

In FIG. 7 an example of a SDM with clamping is shown. An example of a clamping procedure could be that the integrator is reset if the integrator output exceeds 90% of a level corresponding to maximum stable input amplitude.

It is not necessary to monitor and reset the first two integrators. Only integrators having a number higher than 3 should normally be monitored in order to assure stability. In a preferred embodiment, the clamping scheme is implemented so that the last integrator clamps first, then subsequently the second last, and so on.

The error, introduced by the clamping, will be shaped by the first two integrators resulting in a larger DNR. The level where clamping should occur for a specific integrator equals the signal swing at the output of that specific integrator when a signal equal to MSA is applied to the input of that integrator.

When an integrator is completely reset in order to maintain stability then distortion is introduced. However, the distortion will be suppressed by the gain of the first and second integrators.

Resetting is in fact not always necessary in order to maintain stability. In order to maintain stability it may only be necessary to multiply (or subtract) the state variable of the integrator by a factor which ensures that the output of the integrator will not increase in a uncontrollable way. This clamping procedure ensures that the modulator can be operated in an overload mode where it is capable of handling a signal larger than MSA. In fact it can be designed so that the maximum input can be as large as the full scale output signal level of the quantizer (assuming for simplicity that $a_1$ equals $b_1$) whereby a much larger dynamic range is obtained. Combined with the design procedure for the NTF this means that the SDM will have a much larger DNR than conventionally operated SDMs. Furthermore, much lower distortion at high output signal levels can be achieved compared to conventionally operated SDM's.

As shown in FIG. 3, the process following signal swing adaptation 311, is a design-process involving the calculation of the above-mentioned factors—the so-called soft clamping factors.

Figure 8:
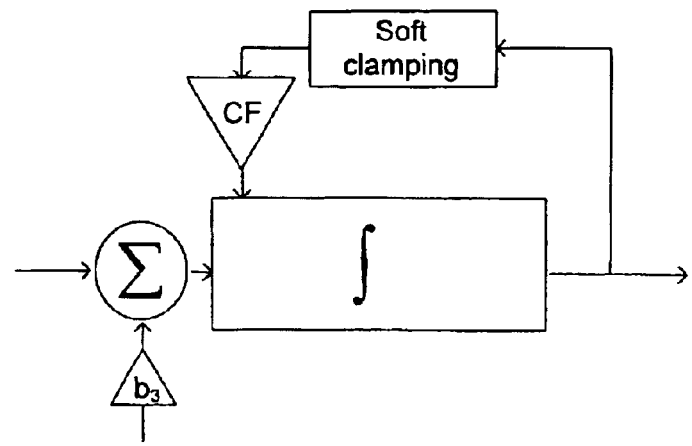
FIG. 8 shows the implementation of soft clamping of an integrator, FIG. 9 the steps of determining coefficients and clamping levels is shown.

In FIG. 8, soft clamping of an integrator is illustrated. When soft clamping is applied, it is checked whether the output signal is above a predefined clamping level. If this is the case, a clamping factor/value $\alpha_{(n)}$ is multiplied/subtracted to/from the state variable. The clamping level and clamping factor are determined for each integrator.

Figure 9:
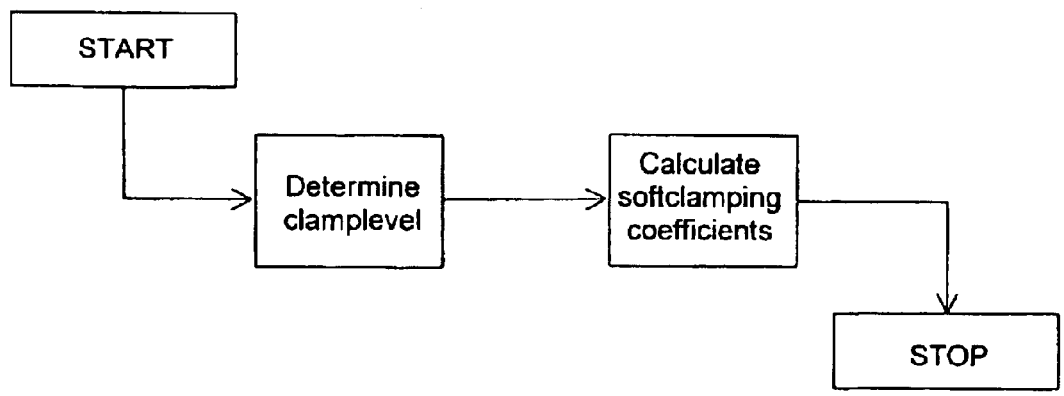

In FIG. 9, the individual steps in a soft clamping process are shown. Soft-clamping coefficients are calculated in the following way:

For a given integrator (number n in the signal path) it is needed to define the maximum signal level output from the preceding integrator (number n-1). This maximum signal level is defined as $Out_{(n-1)\_max}$. The clamping level of integrator n is denoted $clamp_{(n)}$.

The maximum signal level reaching the integrator via the feedback branch is $b_{(n)} \cdot max\_quantizer\_level = b_{(n)}$, if the max output from the quantizer is 1. This is the case when the quantizer only has to levels.

The soft clamping coefficient $\alpha_{(n)}$ for integration may then be calculated as:

$$\alpha_{(n)} \leq \frac{clamp_{(n)}}{clamp_{(n)} + g \cdot (Out_{(n-1)\_max} + b_{(n)})}$$

The above-mentioned expression is valid for one implementation. Other expressions can be derived for other specific implementations. Thus, soft clamping is not restricted to specific implementations.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. An analog-to-digital converter comprising
a sigma-delta-modulator comprising
a plurality of cascaded integrators,
a comparator for signal quantization,
monitoring means adapted to monitor a signal swing of an output signal of at least one of the plurality of integrators and to determine if the monitored signal swing exceeds a predefined threshold value, the predefined threshold value being associated with a maximum stable input amplitude of the sigma-delta-modulator, and
controlling means adapted to reduce the output signal of at least one of the plurality of integrators by a predefined factor or value so as to bring the monitored signal swing below the predefined threshold value.

2. A microphone module comprising an analog-to-digital converter according to claim 1.

3. A mobile unit comprising an analog-to-digital converter according to claim 2.

4. A mobile unit according to claim 3, wherein the mobile unit is selected from the group consisting of: hearing aids, cellular phones and head-sets.

5. An analog-to-digital converter according to claim 1, wherein the predefined threshold value is less than 90% of a maximum stable input amplitude.

6. An analog-to-digital converter according to claim 1, comprising at least three cascaded integrators, wherein the monitoring means and the controlling means are adapted to function for each of the at least one integrators positioned as number three and onwards away from the input.

7. An analog-to-digital converter according to claim 1, wherein the controlling means is adapted to reduce the output signal by multiplying a state variable of the at least one integrator by a predetermined clamping factor.

* * * * *